United States Patent
Yang et al.

(10) Patent No.: US 8,304,473 B2
(45) Date of Patent: Nov. 6, 2012

(54) CARBON/EPOXY RESIN COMPOSITION AND METHOD OF PRODUCING A CARBON-EPOXY DIELECTRIC FILM USING THE SAME

(75) Inventors: Yoo-Seong Yang, Daejeon-si (KR); Eun-Sung Lee, Seoul (KR); Sang-Soo Jee, Gimpo-si (KR); Soon-Jae Kwon, Seongnam-si (KR)

(73) Assignees: Samsung Electronics Co., Ltd. (KR); Samsung Electro-Mechanics Co., Ltd. (KR)

( * ) Notice: Subject to any disclaimer, the term of this patent is extended or adjusted under 35 U.S.C. 154(b) by 494 days.

(21) Appl. No.: 12/509,983

(22) Filed: Jul. 27, 2009

(65) Prior Publication Data
US 2010/0201004 A1 Aug. 12, 2010

(30) Foreign Application Priority Data
Feb. 11, 2009 (KR) .................. 10-2009-0010847

(51) Int. Cl.
C08G 59/20 (2006.01)
C08G 59/40 (2006.01)
C08G 59/22 (2006.01)
C08G 59/18 (2006.01)
C08G 59/50 (2006.01)
C08G 65/14 (2006.01)
C08G 59/42 (2006.01)
C08G 59/56 (2006.01)
C08G 59/58 (2006.01)
C08L 63/02 (2006.01)

(52) U.S. Cl. ........ 523/400; 523/403; 523/404; 523/427; 523/428; 523/468; 528/93; 528/103; 528/103.5; 528/112; 528/113

(58) Field of Classification Search .................. 523/400, 523/403, 404, 427, 428, 468; 528/93, 103, 528/103.5, 112, 113
See application file for complete search history.

(56) References Cited

U.S. PATENT DOCUMENTS

| | | | |
|---|---|---|---|
| 4,617,584 A * | 10/1986 | Ikeya et al. | 257/793 |
| 5,597,886 A | 1/1997 | Moser et al. | |
| 5,656,350 A * | 8/1997 | Koyama et al. | 428/842.8 |
| 5,817,736 A | 10/1998 | von Gentzkow et al. | |
| 6,030,713 A | 2/2000 | Hollstein et al. | |
| 6,864,306 B2 | 3/2005 | Rao et al. | |
| 2009/0121195 A1 * | 5/2009 | Lee et al. | 252/503 |

FOREIGN PATENT DOCUMENTS

| JP | 2001-240728 A | 9/2001 |
|---|---|---|
| KR | 1020040070877 A | 8/2004 |

* cited by examiner

*Primary Examiner* — Michael Pepitone
(74) *Attorney, Agent, or Firm* — Cantor Colburn LLP

(57) ABSTRACT

A carbon/epoxy resin composition and a method of producing a carbon-epoxy dielectric using the same. The carbon/epoxy resin composition includes about 45 volume percent (volume %) to about 50 volume % of an epoxy composition, the epoxy composition including a bisphenol-based epoxy compound and an alicyclic epoxy compound, based on a total volume of the carbon/epoxy resin composition, about 2.0 volume % to about 3.1 volume % of carbon black, based on a total volume of the carbon/epoxy resin composition, about 80 parts by volume to about 104 parts by volume of an acid anhydride-based curing agent, based on 100 parts by volume of the epoxy composition, and about 1 part by volume to about 3 parts by volume of a tertiary alkylamine-based curing catalyst, based on 100 parts by volume of the epoxy composition.

11 Claims, 2 Drawing Sheets

(a) (b)

CARBON/EPOXY RESIN COMPOSITION AND METHOD OF PRODUCING A CARBON-EPOXY DIELECTRIC FILM USING THE SAME

CROSS-REFERENCE TO RELATED APPLICATION

This application claims priority to Korean Patent Application No. 10-2009-0010847, filed on Feb. 11, 2009, and all the benefits accruing therefrom under 35 U.S.C. §119, the content of which in its entirety is herein incorporated by reference.

BACKGROUND

1) Field

This disclosure relates to a carbon/epoxy resin composition and a method of producing a carbon-epoxy dielectric layer using the same.

2) Description of the Related Art

A passive device, such as a register, a capacitor, an inductor, etc. is embedded in a printed circuit board ("PCB") to decrease the surface area of the board so that a resulting device may have reduced size and weight. In addition, when a passive device is embedded in a PCB, inductance may be decreased, improving electrical performance, and the number of solder joints is decreased, improving the reliability of the device and reducing cost.

An embedded capacitor, which is one example of a passive device, may have a capacitance of 1 picofarad (pF) to 1 microfarad (μF) or more depending upon the application.

It is possible to provide a thin capacitor having a high capacitance by using a thin film process such as sputtering, chemical vapor deposition ("CVD") or the like. However, a thin film process has a drawback in that it is difficult to perform at a low temperature, a ceramic thin film is fragile when it is applied to an organic board and the cost of the manufacturing process is high. Therefore, it is difficult to commercialize such a capacitor by applying sputtering or CVD to an organic board, such as an epoxy board, for example an FR-4 board, or a flexible board.

A polymer thick film process is an inexpensive process and is reliable when used with an organic board, but it has a drawback in that the resulting film has low dielectric capacity.

Recently, there have been many attempts to overcome the drawbacks of thin film processes, use the advantages of thick film processes and achieve high capacitance by dispersing conductive particles, such as metal or carbon black particles, in a thermosetting polymer matrix and adjusting the concentration thereof around the percolation threshold.

Currently, a carbon black polymer composite having a high dielectric constant is obtained by including an imidazole-based curing catalyst and carbon black as a conductive material. In this case, the imidazole-based catalyst may be poisoned by the carbon black. As the result, the carbon black-polymer composite has a high dielectric constant, but the polymer matrix is less cured so the general dielectric loss ratio is increased, making commercialization difficult.

Accordingly, a new method of decreasing the dielectric loss ratio, by improving thermal stability and increasing a degree of curing, by further adding an organic acid to the carbon black-polymer composite to decrease the poisoning, is being developed. However, the dielectric loss ratio when an organic acid is added is decreased too little, making commercialization difficult.

SUMMARY

One embodiment provides a carbon/epoxy resin composition having a high dielectric constant and a low dielectric loss ratio.

Another embodiment provides a method of producing a carbon-epoxy dielectric layer.

Another embodiment provides a semiconductor device including a carbon-epoxy dielectric layer using the carbon/epoxy resin composition.

According to one embodiment, disclosed is a carbon/epoxy resin composition that includes about 45 volume percent (volume %) to about 50 volume % of an epoxy composition, based on a total volume of the carbon/epoxy resin composition, the epoxy composition including a bisphenol-based epoxy compound and an alicyclic epoxy compound, about 2.0 volume % to about 3.1 volume % of carbon black, based on an total volume of the carbon/epoxy resin composition, about 80 parts by volume to about 104 parts by volume of an acid anhydride-based curing agent, based on 100 parts by volume of the epoxy composition and about 1 part by volume to about 3 parts by volume of a tertiary alkylamine-based curing catalyst, based on 100 parts by volume of the epoxy composition.

The epoxy composition may include a bisphenol-based epoxy compound and an alicyclic epoxy compound at a volume ratio of about 1:1 to about 4:1.

Examples of the bisphenol-based epoxy compound include a bisphenol A epoxy compound, a bisphenol F epoxy compound, a bisphenol AF epoxy compound or a combination thereof. The bisphenol A epoxy compound may be represented by the following Chemical Formula 1.

Chemical Formula 1

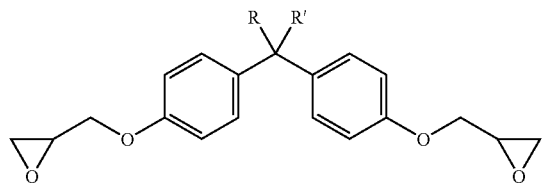

In the above Chemical Formula 1, R and R' are the same or different and each of R and R' is hydrogen, $C_{1-30}$ alkyl or hydroxyl.

Examples of the alicyclic epoxy may include vinylcyclohexene dioxide, dicyclopentadiene dioxide, 3,4-epoxy dihydrocyclopentadienyl glycidyl ether, limonene dioxide, 3,4-epoxycyclohexylmethyl-3',4'-epoxycyclohexane carboxylate, a derivative thereof or a combination thereof. The alicyclic epoxy compound may be a compound represented by the following Chemical Formula 2.

Chemical Formula 2

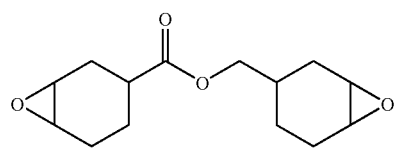

Examples of the acid anhydride-based curing agent include an alicyclic anhydride. The alicyclic anhydride may include methyl tetrahydrophthalic anhydride ("Me-THPA"), methyl hexahydrophthalic anhydride ("Me-HHPA"), methyl hymic anhydride ("MHAC") or a combination thereof.

Examples of the tertiary alkylamine-based curing catalyst include N,N-dimethyloctylamine, N,N-dimethylhexylamine, trimethylamine, tri-n-propylamine or a combination thereof. The carbon/epoxy resin composition may further include about 10 to about 50 parts by weight of a dispersing agent, based on 100 parts by weight of the carbon black. The carbon/epoxy resin composition may be one in which the carbon black is treated with a dispersing agent on a surface thereof. The carbon/epoxy resin composition may further include about 6 to about 10 parts by weight of phosphonic acid, based on 100 parts by weight of the carbon black.

According to another embodiment, disclosed is a method of producing a carbon-epoxy dielectric that includes: dispersing carbon black by ultrasonication to provide a carbon black dispersion; preparing an epoxy solution including an epoxy composition, the epoxy composition including a bisphenol-based epoxy compound and an alicyclic epoxy compound, an acid anhydride-based curing agent and a tertiary alkylamine-based curing catalyst; mixing the carbon black dispersion and the epoxy solution; ultrasonicating the carbon black dispersion and the epoxy solution to provide a carbon/epoxy resin composition; coating the carbon/epoxy resin composition to form a layer; and curing the carbon/epoxy resin composition for about 1.5 hours to about 3 hours at a temperature of about 10° C. less than $T_1$ to about 10° C. greater than $T_1$, wherein $T_1$ is a temperature of an exotherm of the carbon/epoxy resin composition when the carbon/epoxy resin composition is analyzed by thermogravimetric analysis ("TGA") or differential scanning calorimetry ("DSC").

The dispersing carbon black may be performed by further adding a dispersing agent and the ultrasonication may be performed for about 0.5 hour to about 1 hour. The ultrasonicating may be performed for about 0.5 hour to about 1 hour. The curing may be performed at about 160° C. to about 180° C. for about 1.5 hours to about 3 hours.

The curing process may be performed by increasing the temperature from room temperature to about 80° C. to about 100° C., maintaining the temperature for about 0.5 hour to about 1.5 hours, increasing the temperature to about 160° C. to about 180° C. and maintaining the temperature for about 1.5 hours to about 3 hours.

According to an embodiment, disclosed is a semiconductor device including a carbon-epoxy dielectric including a carbon/epoxy resin composition, the carbon/epoxy resin composition including about 45 volume percent to about 50 volume percent of an epoxy composition, based on a total volume of the carbon/epoxy resin composition, the epoxy composition including a bisphenol-based epoxy compound and an alicyclic epoxy compound; about 2.0 volume percent to about 3.1 volume percent of carbon black, based on a total volume of the carbon/epoxy resin composition; about 80 parts by volume to about 104 parts by volume of an acid anhydride-based curing agent, based on 100 parts by volume of the epoxy composition; and about 1 part by volume to about 3 parts by volume of a tertiary alkylamine-based curing catalyst, based on 100 parts by volume of the epoxy composition.

The semiconductor device may be an embedded capacitor.

Hereinafter, further aspects of the embodiments will be described in further detail.

BRIEF DESCRIPTION OF THE DRAWINGS

The above and other aspects, advantages and features of this disclosure will become more apparent by describing in further detail exemplary embodiments thereof with reference to the accompanying drawings, in which.

DETAILED DESCRIPTION

Figure 1:
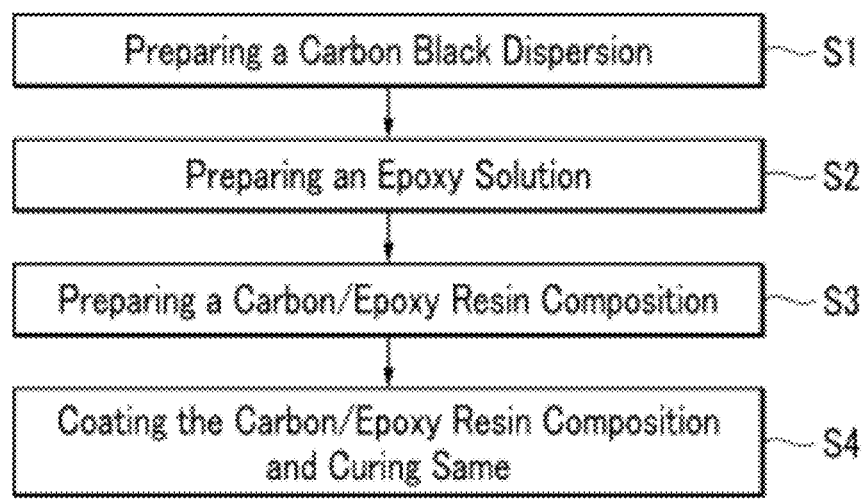
FIG. 1 is a schematic diagram showing an exemplary embodiment of a method of producing a carbon-epoxy dielectric layer.

The present invention will be described more fully hereinafter in the following detailed description of the invention, in which some but not all embodiments of the invention are described. This invention may be embodied in many different forms and should not be construed as limited to the embodiments set forth herein; rather, these embodiments are provided so that this disclosure will be thorough and complete and will fully convey the scope of the invention to those skilled in the art. Like reference numerals refer to like elements throughout.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting. As used herein, the terms "a" and "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

A carbon/epoxy resin composition according to one embodiment includes about 35 volume percent (volume %) to about 60 volume %, specifically about 45 volume % to about 50 volume %, more specifically about 47 volume % of an epoxy composition, based on a total volume of the carbon/epoxy resin composition, the epoxy composition including a bisphenol-based epoxy compound and an alicyclic epoxy compound, about 1 volume % to about 4 volume percent, specifically about 2.0 volume % to about 3.1 volume %, more specifically about 2.5 volume % of carbon black, based on a total volume of the carbon/epoxy resin composition, about 70 parts by volume to about 114 parts by volume, specifically about 80 parts by volume to about 104 parts by volume, more specifically about 90 parts by volume of an acid anhydride-based curing agent, based on 100 parts by volume of the epoxy composition, and about 0.5 part by volume to about 5 parts by volume, specifically about 1 part by volume to about 3 parts by volume, more specifically about 2 parts by volume of a tertiary alkylamine-based curing catalyst, based on 100 parts by volume of the epoxy composition.

The epoxy composition may include a bisphenol-based epoxy compound and an alicyclic epoxy compound at a volume ratio of about 1:1 to about 4:1, specifically about 2:1 to about 3:1, more specifically about 2.5:1.

When the amount of each component of the carbon/epoxy resin composition is within the foregoing range, a carbon-epoxy dielectric layer obtained from the carbon/epoxy resin composition has a high dielectric constant and a low dielectric loss ratio, and thus has improved dielectric properties.

Since the carbon/epoxy resin composition includes a tertiary alkylamine-based curing catalyst, the catalyst is less poisoned by carbon black than an embodiment wherein an imidazole-based curing catalyst is used, thereby improving the cure of the epoxy composition. When the cure of the epoxy composition is improved, the dielectric loss ratio is decreased, improving the dielectric properties.

Because the carbon/epoxy resin composition includes carbon black, the dielectric constant is higher and the dielectric properties are improved relative to an embodiment not including the carbon black.

The carbon/epoxy resin composition may further include a solvent as the remaining amount, if any, of the total volume %.

The solvent may be included in a amount sufficient to provide a suitable viscosity so that the carbon/epoxy resin composition may form a coating.

The carbon/epoxy resin composition may further include additional additives, such as a dispersing agent, phosphonic acid and the like. In an embodiment wherein the dispersing agent is included, it is possible to control agglomeration of the carbon black to improve the dielectric properties. In an embodiment wherein the phosphonic acid is included, it is possible to improve the dielectric constant of the carbon-epoxy dielectric layer obtained by using the carbon/epoxy resin composition.

Hereinafter, each component included in the carbon/epoxy resin composition is further described.

Epoxy Composition

The epoxy composition includes a bisphenol-based epoxy compound and an alicyclic epoxy compound. The epoxy composition may be prepared by mixing at least one bisphenol-based epoxy compound and at least one alicyclic epoxy compound.

As a non-limiting example of the bisphenol-based epoxy compound, the bisphenol-based epoxy compound may be selected from the group consisting of a bisphenol A epoxy compound, a bisphenol F epoxy compound, a bisphenol AF epoxy compound, and the like and a combination thereof, but is not limited thereto. The bisphenol-based epoxy compound may be a compound represented by the following Chemical Formula 1.

Chemical Formula 1

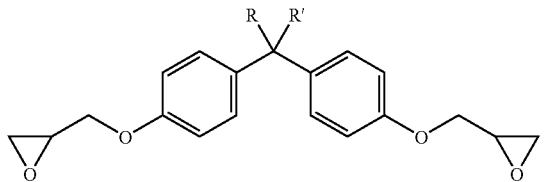

In the above Chemical Formula 1, R and R' are the same or different and each of R and R' is hydrogen, a $C_{1-30}$ alkyl or hydroxyl.

Non-limiting examples of the bisphenol A epoxy compound may include the diglycidyl ether of bisphenol A ("DGEBA").

The bisphenol-based epoxy compound is sufficiently cured and has an increased degree of curing, thus the dielectric loss ratio is decreased. However, since the bisphenol-based epoxy compound has high viscosity, the thin film may become too thick when produced by using the bisphenol-based epoxy compound alone. Accordingly, it may be used as an epoxy mixture by mixing it with an alicyclic epoxy compound.

The alicyclic epoxy compound may be an epoxy compound substituted with an alicyclic group, wherein the term "alicyclic group" refers to a $C_3$ to $C_{30}$ cycloalkyl group, a $C_3$ to $C_{30}$ cycloalkenyl group, a $C_3$ to $C_{30}$ cycloalkynyl group, a $C_3$ to $C_{30}$ heterocycloalkyl group, a $C_3$ to $C_{30}$ heterocycloalkenyl group or a $C_3$ to $C_{30}$ heterocycloalkynyl group, wherein the term "hetero" refers to a heteroatom selected from the group consisting of N, O, S, Si and P. In an embodiment, 0 to about 4, specifically about 1 to about 4, more specifically about 2 to about 3 heteroatoms may be present in one ring. In another embodiment, the alicyclic epoxy compound may be an epoxy compound substituted with an alicyclic group, wherein the alicyclic group is a $C_3$ to $C_{12}$ cycloalkyl group, a $C_3$ to $C_{12}$ cycloalkenyl group, a $C_3$ to $C_{12}$ cycloalkynyl group, a $C_3$ to $C_{12}$ heterocycloalkyl group, a $C_3$ to $C_{12}$ heterocycloalkenyl group or a $C_3$ to $C_{12}$ heterocycloalkynyl group.

Non-limiting examples of the alicyclic epoxy compound include vinyl cyclohexene dioxide, dicyclopentadiene dioxide, 3,4-epoxy dihydrocyclopentadienyl glycidyl ether, limonene dioxide, 3,4-epoxycyclohexylmethyl-3',4'-epoxycyclohexane carboxylate, a derivative thereof and a combination thereof, but are not limited thereto.

The alicyclic compound may be a compound represented by the following Chemical Formula 2.

Chemical Formula 2

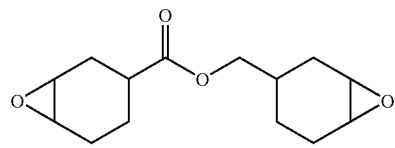

Since the alicyclic epoxy compound has lower viscosity than that of the bisphenol-based epoxy compound, it is possible to solve the problem of high viscosity, which, while not wanting to be bound by theory, is thought to be caused by using the bisphenol-based epoxy compound alone.

The bisphenol-based epoxy compound and the alicyclic epoxy compound may be mixed in a volume ratio of about 1:1 to about 4:1, specifically about 2:1 to about 3:1, more specifically about 2.5:1. When they are used in the foregoing volume ratio, the epoxy composition is well cured, decreasing the dielectric loss ratio, and a suitable viscosity of the carbon/epoxy resin composition is maintained, thereby controlling the thickness of a layer upon coating.

The epoxy composition may be included in an amount of about 35 volume % to about 60 volume %, specifically about 45 volume % to about 50 volume %, more specifically about 47 volume %, based on the total volume % of the carbon/epoxy resin composition. When the epoxy composition is included in this range, the carbon-epoxy dielectric layer has excellent dielectric properties.

(B) Carbon Black

The carbon black is a conductive material and has a structure with a high surface area, thus, while not wanting to be bound by theory, it is believed that addition of carbon black improves the dielectric constant of the carbon-epoxy dielectric layer.

The carbon black may have a surface area of equal to or greater than about 500 square meters per liter ($m^2/l$), specifically equal to or greater than about 800 $m^2/l$, more specifically equal to or greater than about 1500 $m^2/l$, and have a dibutylphthalate ("DBP") absorption of equal to or greater than about 200 milliliters (ml) per 100 grams (g), specifically equal to or greater than about 300 ml per 100 g, more specifically equal to or greater than about 400 ml per 100 g. Non-limiting examples of the carbon black may include KETJENBLACK EC-300J (manufactured by MITSUBISHI CHEMICAL) or KETJENBLACK EC-600JD (manufactured by MITSUBISHI CHEMICAL), but are not limited thereto. The carbon black may include any carbon black as long as the surface area and the DBP absorption are within the foregoing range.

The carbon black may be included at about 1 volume % to about 4 volume percent, specifically about 2.0 volume % to about 3.1 volume %, more specifically about 2.5 volume %, based on the total volume of the carbon/epoxy resin composition. When the amount of carbon black is within the foregoing range, it is possible to optimize the distance among carbon black particles and further improve the dielectric properties. Accordingly, it is beneficial for the carbon black to be included in the foregoing range in order to provide a carbon-epoxy dielectric layer with a high dielectric constant and a low dielectric loss ratio.

(C) Acid Anhydride-Based Curing Agent

The acid anhydride-based curing agent may promote curing of the epoxy compounds by a cross-linking reaction of the epoxy compounds.

The acid anhydride-based curing agent may be an alicyclic anhydride, thus can be a cycloaliphatic anhydride. In an embodiment, the alicyclic group may be a $C_3$ to $C_{30}$ cycloalkyl group, a $C_3$ to $C_{30}$ cycloalkenyl group, a $C_3$ to $C_{30}$ cycloalkynyl group, a $C_3$ to $C_{30}$ heterocycloalkyl group, a $C_3$ to $C_{30}$ heterocycloalkenyl group or a $C_3$ to $C_{30}$ heterocycloalkynyl group, and may include at least one heteroatom selected from the group consisting of N, O, S, Si and P. In an embodiment, 0 to about 4, specifically about 1 to about 4, more specifically about 2 to about 3 heteroatoms may be present in one ring.

Non-limiting examples of the alicyclic anhydride may include methyl tetrahydrophthalic anhydride ("Me-THPA"), methyl hexahydrophthalic anhydride ("Me-HHPA"), methyl hymic anhydride ("MHAC"), or the like or a combination thereof, but are not limited thereto.

The acid anhydride-based curing agent may be included at about 70 parts by volume to about 114 parts by volume, specifically about 80 parts by volume to about 104 parts by volume, more specifically 90 parts by volume, based on 100 parts by volume of the epoxy composition. When the acid anhydride-based curing agent is included in the foregoing range, the epoxy composition is sufficiently cured, and the carbon-epoxy dielectric layer has a decreased dielectric loss ratio and improved storage stability.

(D) Tertiary Alkylamine-Based Curing Catalyst

The tertiary alkylamine-based curing catalyst plays a role of accelerating the curing among the epoxy compounds. When using an imidazole-based curing catalyst, the catalyst may be poisoned by carbon black, which is a component of the carbon/epoxy resin composition. However, the tertiary alkylamine-based curing catalyst may prevent or substantially decrease the poisoning of the catalyst due to the carbon black, so that both the curing catalyst and the carbon black effectively perform their desired functions.

The tertiary alkylamine-based curing catalyst decreases the dielectric loss ratio of the carbon-epoxy dielectric layer by accelerating the curing of the epoxy composition.

Alkyl groups in the tertiary alkylamine-based curing catalyst may be the same or the different from each other, and they may independently be a substituted or unsubstituted $C_1$ to $C_{20}$ linear or branched alkyl, a substituted or unsubstituted $C_1$ to $C_{12}$ linear or branched alkyl or an unsubstituted $C_1$ to $C_{20}$ linear alkyl group.

Non-limiting examples of the tertiary alkylamine-based curing catalyst may be selected from the group consisting of N,N-dimethyloctylamine, N,N-dimethylhexylamine, trimethylamine, tri-n-propylamine, and the like and a combination thereof, but are not limited thereto.

The tertiary alkylamine-based curing catalyst may be included at about 0.5 part by volume to about 5 parts by volume, specifically about 1 part by volume to about 3 parts by volume, more specifically about 2 parts by volume based on 100 parts by volume of the epoxy composition. When the tertiary alkylamine-based curing catalyst is included in the foregoing range, the epoxy composition is sufficiently cured so that the carbon-epoxy dielectric layer has a decreased dielectric loss ratio and improved storage stability.

(E) Solvent

Non-limiting examples of the solvent may be selected from the group consisting of ethyl acetate, n-butyl acetate, isobutyl acetate, ethylene glycol monomethylether acetate, ethylene glycol n-butyl ether acetate, diethylene glycol dimethylether, diethylene glycol methyl ethyl ether, diethylene glycol ethylether acetate, dipropylene glycol, n-butylether, tripropylene glycol, n-propylether, tripropylene glycol methylether, propylene glycol methylether acetate, propylene glycol diacetate, propylene glycol monomethylether, propylene glycol monoethylether acetate, cyclohexanone, ethyl 3-methoxypropionate, 3-methyl ethoxy propionate, ethyl 3-ethoxy propionate, and the like and a combination thereof, but are not limited thereto. In one embodiment, the solvent may be selected from the group consisting of ethyl acetate, ethylene glycol n-butylether acetate ("EGBEA"), propylene glycol diacetate ("PGDA"), dipropylene glycol monomethylether ("DPGME"), diethylene glycol monoethylether (carbitol), and the like and a combination thereof. The solvent may be included as the remaining amount other than the components based on the total amount of carbon/epoxy resin composition, and it may be included in a sufficient amount so the carbon/epoxy resin composition has a viscosity suitable for coating.

(F) Additional Additives

The carbon/epoxy resin composition may further include an additive, such as a dispersing agent, phosphonic acid and the like.

The dispersing agent may control the agglomeration of carbon black particles. The dispersing agent may have a hydrophilic group and a hydrophobic group that is capable of controlling agglomeration among the carbon black particles. The surface of the carbon black for a carbon/epoxy resin composition may be treated with a dispersing agent.

Non-limiting examples of the dispersing agent may be selected from the group consisting of DISPERBYK-163 (manufactured by BYK Chemie), DISPERBYK-164 (manufactured by BYK Chemie), DISPERBYK-2050 (manufactured by BYK Chemie), DISPERBYK-2150 (manufactured by BYK Chemie), DISPERBYK-2155 (manufactured by BYK Chemie), and the like and a combination thereof, but are not limited thereto.

The dispersing agent may be included at about 5 parts by weight to about 90 parts by weight, specifically about 10 parts by weight to about 50 parts by weight, more specifically about 20 parts by weight to about 40 parts by weight, based on about 100 parts by weight of the carbon black. When the dispersing agent is included in the foregoing range, it is possible to facilitate dispersion of the carbon black so as to control the agglomeration among carbon black particles.

The phosphonic acid may further increase the dielectric constant of carbon-epoxy dielectric layer.

Non-limiting examples of the phosphonic acid may include phosphonic acid substituted with an alkyl group or phosphonic acid substituted with an aryl group, wherein the alkyl group is a $C_1$ to $C_{30}$ alkyl group and the aryl group is a $C_6$ to $C_{30}$ aryl group.

Further non-limiting examples of phosphonic acid may include n-tetradecylphosphonic acid ("TDPA") or GAFAC RE610 (manufactured by Toho Chemical), but are not limited thereto.

The phosphonic acid may be included at about 3 parts by weight to about 20 parts by weight, specifically about 6 parts by weight to about 10 parts by weight, more specifically 8 parts by weight, based on 100 parts by weight of the carbon black. When phosphonic acid is included in the foregoing range, it is possible to further improve the dielectric constant of the carbon-epoxy dielectric layer.

FIG. 1 is a process diagram illustrating an exemplary embodiment of a method of producing the carbon-epoxy dielectric layer.

Hereinafter, an exemplary embodiment of a method of producing the carbon-epoxy dielectric layer is described referring to FIG. 1.

According to another embodiment, provided is a method of producing a carbon-epoxy dielectric layer, the method including: dispersing carbon black by ultrasonication to provide a carbon black dispersion in a first operation S1; preparing an epoxy solution including an epoxy composition, the epoxy composition including a bisphenol-based epoxy compound and an alicyclic epoxy compound, an acid anhydride-based curing agent and a tertiary alkylamine-based curing catalyst in a second operation S2; mixing the carbon black dispersion and the epoxy solution and subjecting them to ultrasonication to provide a carbon/epoxy resin composition in a third operation S3; coating the carbon/epoxy resin composition to form a layer, and curing the carbon/epoxy resin composition for about 0.5 hour to about 5 hours, specifically about 1.5 hours to about 3 hours, more specifically about 2 hours at a temperature of about 10° C. less than $T_1$ to about 10° C. greater than $T_1$, thus about $T_1 \pm 10°$ C., wherein $T_1$ is a temperature of an exotherm of the carbon/epoxy resin composition shown in a thermogravimetric analysis ("TGA") curve and/or a differential scanning calorimetry ("DSC") curve, in a fourth operation S4.

The first operation S1 of preparing the carbon black dispersion is performed with ultrasonication. The carbon black is the same as described above in the carbon/epoxy resin composition. The ultrasonication may be performed for about 0.1 hour to about 2 hours, specifically about 0.5 hour to about 1 hour, more specifically for about 0.7 hour, but is not limited thereto. When the ultrasonication is performed within the range, the carbon black is sufficiently dispersed. In the first operation S1 of preparing the carbon black dispersion, the carbon black may be dispersed by further adding the dispersing agent. The dispersing agent may be added before or after the ultrasonication.

When the agglomeration of carbon black is prevented by the dispersing process, the carbon black is dispersed while maintaining a certain distance between particles thereof to improve the dielectric properties of the carbon-epoxy dielectric layer.

The second operation S2 of preparing the epoxy solution may be performed by mixing an epoxy composition including a bisphenol-based epoxy compound and an alicyclic epoxy compound, an acid anhydride-based curing agent and a tertiary alkylamine-based curing catalyst, and agitating the same. In an embodiment, the epoxy composition, the acid anhydride-based curing agent, and the tertiary alkylamine-based curing catalyst are the same as above described in the carbon/epoxy resin composition.

The third operation S3 of preparing the carbon/epoxy resin composition may be performed by mixing the carbon black dispersion and the epoxy solution and subjecting the same to ultrasonication.

If the carbon black dispersion and the epoxy solution are left to stand after mixing, the carbon black sinks to the bottom of the container, and may provide a precipitate. When the carbon black is precipitated or sinks to the bottom of the container, the obtained carbon-epoxy dielectric layer does not have excellent dielectric properties. Therefore, after mixing the carbon black dispersion with the epoxy solution, the carbon black may be dispersed by ultrasonication again. The second ultrasonication may be performed for about 0.1 hour to about 2 hours, specifically about 0.5 hour to about 1 hour, more specifically for about 0.7 hour. When the ultrasonication is performed within the foregoing range of time, the carbon/epoxy resin composition is sufficiently dispersed, and it is possible to substantially prevent or effectively eliminate undesirable thermal setting of the epoxy composition.

Then, in an embodiment, the obtained carbon/epoxy resin composition is evaporated, using a rotary evaporator, for example, to remove the solvent and provide a composition with a suitable viscosity for coating. The rotary evaporation is performed for about 0.5 hour to about 4 hours, specifically about 1 hour to about 2 hours, more specifically about 1.5 hours, but is not limited thereto. The carbon/epoxy resin composition, from which the solvent has been evaporated, may have a viscosity of about 1,000 centipoise (cps) to about 40,000 cps, specifically about 1,000 cps to about 20,000 cps, more specifically about 10,000 cps, but is not limited thereto.

In the fourth operation S4 of coating and curing the carbon/epoxy resin composition, the carbon/epoxy resin composition may be coated by tape casting, tape printing, spin coating, roll coating, screen printing, inkjet printing or the like, but is not limited thereto.

The curing condition may be monitored by thermogravimetric analysis ("TGA"), or differential scanning calorimetry ("DSC"). The results of TGA or DSC analysis show a peak, the peak associated with a temperature $T_1$. Thus $T_1$ is a temperature of a peak of an exotherm that may be observed on a TGA and/or a DSC curve, and the temperature of $T_1 \pm 10°$ C. may refer to a curing temperature. The temperature $T_1$ of the exothermal peak refers to a temperature of an exotherm of the carbon/epoxy resin composition, as observed in a TGA and/or a DSC curve.

The curing may be performed at about 150° C. to about 190° C., specifically at about 160° C. to about 180° C., more specifically at about 170° C. for about 0.5 hour to about 5 hours, specifically for about 1.5 hours to about 3 hours, more specifically for about 2 hours. When the carbon/epoxy resin composition is cured under the foregoing conditions, the epoxy composition is sufficiently cured and has sufficient thermal stability to provide a carbon-epoxy dielectric layer uniformly having a high dielectric constant and a low dielectric loss ratio.

The curing may be accomplished by slowly increasing the temperature from about 20° C. to about 125° C., specifically from about room temperature to about 100° C., more specifically from about 30° C. to about 80° C. and maintaining the temperature for about 0.1 hour to about 3 hours, specifically about 0.5 hour to about 1.5 hours, more specifically about 1 hour, then slowly increasing the temperature to about 150° C. to about 200° C., specifically about 160° C. to about 180° C., more specifically about 170° C. and maintaining the temperature for about 0.1 hour to about 5 hours, specifically about 1.5 hours to about 3 hours, more specifically about 2 hours, wherein the room temperature is about 25° C.

The rate of increasing the temperature may be about 1° C./min (minute) to about 20° C./min, specifically about 5° C./min to about 10° C./min, more specifically about 7° C./min. When the temperature is slowly increased, the cured condition is improved and provides a carbon-epoxy dielectric layer with a denser structure. The carbon-epoxy dielectric layer having a denser structure may have a lower dielectric loss ratio.

When the curing is performed by increasing the temperature to about 80° C. to about 100° C. and maintaining it for about 0.5 hour to about 1.5 hours, the remaining solvent of the carbon/epoxy resin composition is substantially evaporated or in an embodiment completely evaporated, providing a carbon-epoxy dielectric layer having a denser structure.

The carbon-epoxy dielectric layer may have a thickness of about 1 μm (micrometer) to about 50 μm, specifically about 15 μm to about 25 μm, more specifically about 20 μm. When the dielectric layer has a thickness within the foregoing range, it is possible to decrease the electrical current loss, and it may be easily mounted in the embedded semiconductor device. The thickness of the dielectric layer may be controlled by adjusting the volume ratio of the bisphenol-based epoxy compound and the alicyclic epoxy compound.

According to an embodiment, provided is a semiconductor device including the carbon-epoxy dielectric layer. The carbon-epoxy dielectric layer has a high dielectric constant and a low dielectric loss ratio, so as to improve the dielectric property. The carbon-epoxy dielectric layer may be utilized as one part of a semiconductor device, but is not limited thereto. It may be applied to various fields requiring a dielectric material.

Non-limiting examples of the semiconductor device include a capacitor, and particular examples of the capacitor may include a decoupling capacitor and a radio frequency ("RF") module capacitor. The semiconductor device may also be an embedded capacitor.

Hereinafter, the embodiments are illustrated in more detail with reference to examples. However, the following are exemplary embodiments and are not limiting.

Preparation of a Carbon/Epoxy Resin Composition

EXAMPLE 1

In a container, 0.264 grams (g) of KETJENBLACK EC-300J (manufactured by MITSUBISHI CHEMICAL) and 0.023 g of DISPERBYK 164 (manufactured by BYK Chemie) are introduced, mixed in 15 g of ethyl acetate, and treated with ultrasonication for 0.5 hour to provide a carbon black dispersion.

In another container, 1.064 g of diglycidyl ether of bisphenol A ("DGEBA"), 1.064 g of 3,4-epoxycyclohexylmethyl-3,4-epoxycyclohexane carboxylate, 0.945 g of tetrahydrophthalic acid anhydride ("TPA"), 0.021 g of n-tetradecylphosphonic acid ("TDPA") and 0.02 g of N,N-dimethyloctylamine are introduced in 15 g of ethyl acetate and mixed with a magnetic stirrer for 0.5 hour to provide an epoxy solution.

The obtained carbon black dispersion and the obtained epoxy solution are put into a container, treated with ultrasonication for 0.5 hour and dispersed while they mixed with a magnetic stirrer to provide a carbon/epoxy resin composition.

COMPARATIVE EXAMPLE 1

A carbon/epoxy resin composition is prepared in accordance with the same procedure as in Example 1, except that it is not treated with ultrasonication. Production of a Carbon-epoxy Dielectric Layer

EXAMPLE 2

The carbon/epoxy resin composition obtained from Example 1 is evaporated for 1.5 hours using a rotary evaporator to remove a solvent to provide a carbon/epoxy resin composition having a viscosity of 10,000 cps.

The obtained carbon/epoxy resin composition is tape-printed on a copper clad laminate ("CCL").

The carbon/epoxy resin composition printed on the CCL is heated from room temperature to 90° C. at a speed of 6° C./min and maintained at that temperature for 1 hour. Then, it is heated to 170° C. at a speed of 6° C./min and maintained at that temperature for 2 hours, and then is naturally cooled to provide a carbon-epoxy dielectric layer.

The production of the carbon-epoxy dielectric layer is repeated twice, the first of which is designated as Example 2-1, and the other of which is Example 2-2.

The carbon-epoxy dielectric layer formed on the CCL has a thickness of 24 μm. Hereinafter, the obtained carbon-epoxy dielectric layer formed on the CCL is used as a specimen in an experimental example.

EXAMPLE 3

A carbon-epoxy dielectric layer is produced in accordance with the same procedure as in Example 2, except that 0.224 g of KETJENBLACK EC-600JD (manufactured by MITSUBISHI CHEMICAL) is used instead of 0.264 g of KETJENBLACK EC-300J; 0.0896 g of DISPERBYK 164 is used instead of 0.023 g of DISPERBYK 164; and 0.0224 g of TDPA is used instead of 0.021 g of TDPA.

The carbon-epoxy dielectric layer is produced twice, the first of which is designated as Example 3-1 and the other as Example 3-2.

The carbon-epoxy dielectric layer formed on the CCL has a thickness of 23 μm. Hereinafter, the obtained carbon-epoxy dielectric layer is used as a specimen in an experimental example.

COMPARATIVE EXAMPLE 2

A carbon-epoxy dielectric layer is produced by the same procedure as in Example 2, except that 0.01 g of 1-methyl imidazole is used as a catalyst instead of 0.02 g of N,N-dimethyloctyl amine.

The carbon-epoxy dielectric layer is produced twice, the first of which is designated as Comparative Example 2-1 and the other as Comparative Example 2-2.

The carbon-epoxy dielectric layer formed on the CCL has a thickness of 23 μm. Hereinafter, the obtained carbon-epoxy dielectric layer is used as a specimen in an experimental example.

COMPARATIVE EXAMPLE 3

A carbon-epoxy dielectric layer is produced by the same procedure as in Example 3, except that 0.01 g of 1-methyl imidazole is used as a catalyst instead of 0.02 g of N,N-dimethyloctyl amine.

The carbon-epoxy dielectric layer is produced twice, the first of which is designated as Comparative Example 3-1, and the other is Comparative Example 3-2.

The carbon-epoxy dielectric layer formed on the CCL has a thickness of 22 μm. Hereinafter, the obtained carbon-epoxy dielectric layer is used as a specimen in an experimental example.

COMPARATIVE EXAMPLE 4

A carbon-epoxy dielectric layer is produced by the same procedure as in Example 2, except that the maintaining time of the curing condition at 170° C. is set to 3 hours.

The carbon-epoxy dielectric layer is produced twice, the first of which is designated as Comparative Example 4-1, and the other is Comparative Example 4-2.

The carbon-epoxy dielectric layer formed on the CCL has a thickness of 24 μm. Hereinafter, the obtained carbon-epoxy dielectric layer is used as a specimen in an experimental example.

Analysis of the Dispersing Effect of Ultrasonication

EXPERIMENTAL EXAMPLE 1

Figure 2:
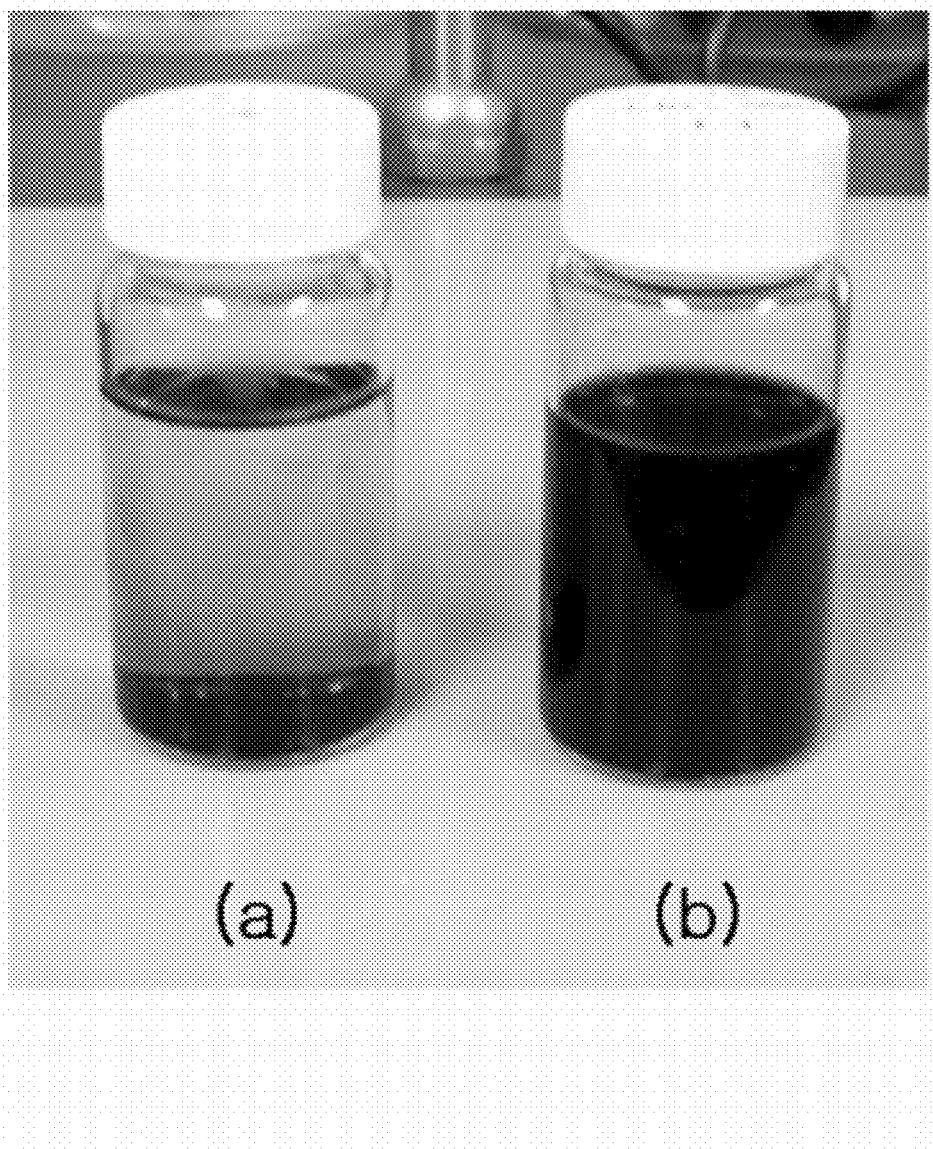
FIG. 2 is a photograph showing a mixture wherein carbon black is dispersed without ultrasonication (a) and a mixture wherein carbon black is dispersed by ultrasonication (b).

FIG. 2 is a photograph of each carbon/epoxy resin composition obtained in Example 1 and Comparative Example 1.

In FIG. 2, (a) shows the carbon/epoxy resin composition that is not treated with ultrasonication, and (b) shows the carbon/epoxy resin composition that is treated with ultrasonication. As shown in FIG. 2, the dispersion of carbon black is still maintained even after a lapse of time from the ultrasonication, and on the other hand, the carbon black settles or is precipitated when the ultrasonication is not performed.

Analysis of Dielectric Properties

EXPERIMENTAL EXAMPLE 2

Each carbon-epoxy dielectric layer obtained from Example 2, Example 3, Comparative Example 2, Comparative Example 3 and Comparative Example 4 is used as a specimen. Each specimen is cut in ten pieces to measure the dielectric constant and dielectric loss ratio by a metal-insulation layer-metal ("MIM") method, and the average thereof is calculated. Since the dielectric constant and dielectric loss ratio of each of the ten pieces of Examples 2-1, 2-2, 3-1 and 3-2, and Comparative Examples 2-1, 2-2, 3-1, 3-2 and 4-1 has less deviation, it is possible to provide a specimen having a relatively uniform dielectric property. However, since the dielectric constant and dielectric loss ratio of the ten pieces of Comparative Example 4-2 have more deviation, the reliability of the measured value is too deteriorated to define the average. The results are shown in the following Table 1.

TABLE 1

| Specimen No. | Dielectric constant (k) | Dielectric loss ratio (%) |
|---|---|---|
| Example 2-1 | 4556 | 56.7 |
| Example 2-2 | 4270 | 56.5 |
| Example 3-1 | 8047 | 112.1 |
| Example 3-2 | 6198 | 109.7 |
| Comparative Example 2-1 | 3204 | 52.3 |
| Comparative Example 2-2 | 3473 | 64.7 |
| Comparative Example 3-1 | 15756 | 393.1 |
| Comparative Example 3-2 | 7122 | 279.2 |
| Comparative Example 4-1 | 2966 | 57.3 |
| Comparative Example 4-2 | — | — |

Comparing the results of Examples 2-1 and 2-2 to those of Comparative Examples 2-1 and 2-2, it is possible to confirm the effect of the tertiary alkylamine-based curing catalyst. The dielectric loss ratio does not show a significant difference between the embodiment using the tertiary alkylamine-based curing catalyst and the embodiment using the imidazole-based curing catalyst. However, the dielectric constant when using a tertiary alkylamine-based curing catalyst is higher by about 1000 than when using an imidazole-based curing catalyst. While not wanting to be bound by theory, it is understood that this is caused by the imidazole-based curing catalyst being poisoned by the carbon black, so that it insufficiently participates during the curing, and the carbon black also does not contribute to improving the dielectric constant.

In addition, comparing the results of Examples 3-1 and 3-2 to those of Comparative Examples 3-1 and 3-2, the effect of the tertiary alkylamine-based curing catalyst is confirmed. The embodiment using a tertiary alkylamine-based curing catalyst decreases the dielectric loss ratio by 200 percent (%) relative to that of the imidazole-based curing catalyst. It is understood that the change in dielectric loss ratio is caused by the tertiary alkylamine-based curing catalyst not being poisoned by the carbon black, thus the curing degree of the epoxy compound is increased. The dielectric constant is higher in the case of using the imidazole-based curing catalyst than when using the tertiary alkylamine-based curing catalyst. However, since the tertiary alkylamine-based curing catalyst significantly affects the decrease of the dielectric loss ratio, it is confirmed that the embodiment using a tertiary alkylamine-based curing catalyst generally provides a carbon-epoxy dielectric layer having improved dielectric properties compared to the embodiment using the imidazole-based curing catalyst.

The effect of curing time on the dielectric properties are confirmed by comparing the results of Examples 2-1 and 2-2 to that of Comparative Example 4-1. There is almost no difference between the dielectric loss ratio when the curing is performed at 170° C. for 2 hours and the dielectric loss ratio when the curing is performed at 170° C. for 3 hours. However, the dielectric constant of the embodiment in which the curing is performed at 170° C. for 2 hours is higher by about 1500 than the embodiment in which the curing is performed at 170° C. for 3 hours. In addition, the material of Comparative Example 4-2 has an excessively high deviation of the dielectric constant and dielectric loss ratio among each of the ten pieces. Therefore, it is confirmed that the embodiment in which the curing is performed for 3 hours or more deteriorates thermal stability to increase the deviation of the dielectric constant and dielectric loss ratio and deteriorates the dielectric properties.

While this invention has been described in connection with exemplary embodiments, it is to be understood that the invention is not limited to the disclosed embodiments, but, on the contrary, is intended to cover various modifications and equivalent arrangements included within the spirit and scope of the appended claims.

What is claimed is:

1. A carbon/epoxy resin composition comprising:
   about 45 volume percent to about 50 volume percent of an epoxy composition, based on a total volume of the carbon/epoxy resin composition, the epoxy composition including a bisphenol-based epoxy compound and an alicyclic epoxy compound;
   about 2.0 volume percent to about 3.1 volume percent of carbon black, based on a total volume of the carbon/epoxy resin composition;
   about 80 parts by volume to about 104 parts by volume of an acid anhydride-based curing agent, based on 100 parts by volume of the epoxy composition; and
   about 1 part by volume to about 3 parts by volume of a tertiary alkylamine-based curing catalyst selected from the group consisting of N,N-dimethyloctylamine, N,N-dimethylhexylamine, tri-n-propylamine, and a combination thereof, based on 100 parts by volume of the epoxy composition.

2. The carbon/epoxy resin composition of claim 1, wherein the epoxy composition includes a bisphenol-based epoxy compound and an alicyclic epoxy compound at a volume ratio of about 1:1 to about 4:1.

3. The carbon/epoxy resin composition of claim 1, wherein the bisphenol-based epoxy compound comprises a compound selected from the group consisting of a bisphenol A epoxy compound, a bisphenol F epoxy compound, a bisphenol AF epoxy compound and a combination thereof.

4. The carbon/epoxy resin composition of claim 1, wherein the bisphenol-based epoxy compound is represented by the following Chemical Formula 1:

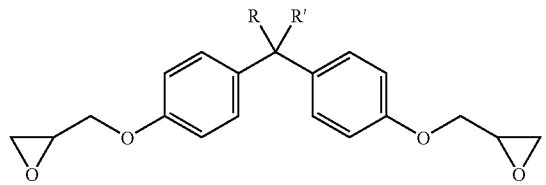

Chemical Formula 1 wherein R and R' are the same or different and each of R and R' is hydrogen, C1-30 alkyl or hydroxyl.

5. The carbon/epoxy resin composition of claim 1, wherein the alicyclic epoxy compound comprises a compound selected from the group consisting of vinylcyclohexene dioxide, dicyclopentadiene dioxide, 3,4-epoxy dihydrocyclopentadienyl glycidyl ether, limonene dioxide, 3,4-epoxycyclohexylmethyl-3',4'-epoxycyclohexane carboxylate, a derivative thereof and a combination thereof.

6. The carbon/epoxy resin composition of claim 1, wherein the alicyclic epoxy compound is represented by the following Chemical Formula 2:

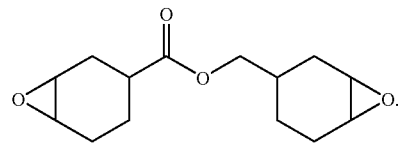

Chemical Formula 2

7. The carbon/epoxy resin composition of claim 1, wherein the acid anhydride-based curing agent comprises an alicyclic anhydride.

8. The carbon/epoxy resin composition of claim 7, wherein the alicyclic anhydride comprises a compound selected from the group consisting of methyl tetrahydrophthalic anhydride, methyl hexahydrophthalic anhydride, methyl hymic anhydride and a combination thereof.

9. The carbon/epoxy resin composition of claim 1, wherein the carbon/epoxy resin composition further comprises about 10 to about 50 parts by weight of a dispersing agent, based on 100 parts by weight of the carbon black.

10. The carbon/epoxy resin composition of claim 9, wherein the carbon black is treated with a dispersing agent on a surface thereof.

11. The carbon/epoxy resin composition of claim 1, wherein the carbon/epoxy resin composition further comprises about 6 to about 10 parts by weight of phosphonic acid, based on 100 parts by weight of the carbon black.

* * * * *